(12) United States Patent
Kim

(10) Patent No.: US 10,326,445 B2
(45) Date of Patent: *Jun. 18, 2019

(54) SENSING APPARATUS AND METHOD BASED ON ELECTROMAGNETIC INDUCTION TYPE

(71) Applicant: Samsung Electronics Co., Ltd., Gyeonggi-do (KR)

(72) Inventor: Byung-Jik Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/789,439

(22) Filed: Oct. 20, 2017

(65) Prior Publication Data

US 2018/0041207 A1 Feb. 8, 2018

Related U.S. Application Data

(63) Continuation of application No. 13/728,588, filed on Dec. 27, 2012, now Pat. No. 9,843,323.

(30) Foreign Application Priority Data

Jan. 6, 2012 (KR) .................. 10-2012-0002049

(51) Int. Cl.
*G06F 3/033* (2013.01)
*G06F 3/041* (2006.01)
(Continued)

(52) U.S. Cl.
CPC ............ *H03K 17/96* (2013.01); *G06F 3/041* (2013.01); *G06F 3/046* (2013.01); *G06F 3/0416* (2013.01); *G06F 3/033* (2013.01); *G06F 3/03545* (2013.01)

(58) Field of Classification Search
CPC .. G06F 3/03545; G06F 3/03547; G06F 3/041; G06F 3/0416; G06F 3/046;
(Continued)

(56) References Cited

U.S. PATENT DOCUMENTS 3,819,857 A 6/1974 Inokuchi
4,029,899 A * 6/1977 Gordon .................. G06F 3/046
178/18.07
(Continued)

FOREIGN PATENT DOCUMENTS

CN 201503583 6/2010
CN 102064381 5/2011
(Continued)

OTHER PUBLICATIONS

Japanese Office Action dated Aug. 29, 2016 issued in counterpart application No. 2013-000124, 6 pages.
(Continued)

*Primary Examiner* — Mirza F Alam
(74) *Attorney, Agent, or Firm* — The Farrell Law Firm, P.C.

(57) ABSTRACT

A sensing apparatus for determining a pen input point includes a sensing loop unit, including loops, to output a first signal from a pen signal, wherein each loop includes two sub-loops separated by a distance; an area determination loop unit including at least one loop to output a second signal from the pen signal; and a controller to determine input point candidates based on the first signal and determine the input point from the input point candidates based on the second signal, wherein the two sub-loops are in series, wherein one sub-loop of the two sub-loops is disposed inside of an area in which one loop of the area determination loop unit is disposed and another sub-loop of the two sub-loops is disposed outside of the area in which the one loop is
(Continued)

disposed, and wherein each loop of the sensing loop unit determines the candidates of the input point.

33 Claims, 6 Drawing Sheets

(51) Int. Cl.
*H03K 17/96* (2006.01)
*G06F 3/046* (2006.01)
*G06F 3/0354* (2013.01)

(58) Field of Classification Search
CPC .............. G06F 3/045; G06F 1/3262; G06F 2203/0339; H03K 17/96; G01D 5/2053
See application file for complete search history.

(56) References Cited

U.S. PATENT DOCUMENTS

| | | | | |
|---|---|---|---|---|
| 4,205,199 A | * | 5/1980 | Mochizuki | G06F 3/046 178/18.03 |
| 4,878,553 A | | 11/1989 | Yamanami et al. | |
| 5,028,745 A | * | 7/1991 | Yamanami | G06F 3/03545 178/18.07 |
| 5,466,896 A | * | 11/1995 | Murakami | G06F 3/046 178/18.07 |
| 6,787,715 B2 | | 9/2004 | Chao et al. | |
| 2002/0179339 A1 | * | 12/2002 | Ely | G01D 5/2073 178/18.07 |
| 2003/0217871 A1 | * | 11/2003 | Chao | G06F 3/046 178/18.01 |
| 2005/0171714 A1 | * | 8/2005 | Ely | G06F 1/3203 702/75 |
| 2006/0033011 A1 | | 2/2006 | Choi et al. | |
| 2007/0146351 A1 | * | 6/2007 | Katsuhira | G06F 3/03545 345/179 |
| 2008/0158165 A1 | | 7/2008 | Geaghan | |
| 2011/0216032 A1 | * | 9/2011 | Oda | G06F 3/044 345/174 |
| 2012/0092296 A1 | * | 4/2012 | Yanase | G06F 3/0416 345/174 |
| 2012/0320000 A1 | * | 12/2012 | Takatsuka | G06F 1/1626 345/179 |
| 2013/0069636 A1 | | 3/2013 | Kim | |

FOREIGN PATENT DOCUMENTS

| | | |
|---|---|---|
| CN | 102169402 | 8/2011 |
| EP | 2 530 567 | 12/2012 |
| EP | 2 613 233 | 4/2018 |
| JP | 48-56341 | 8/1973 |
| JP | 49-37535 | 4/1974 |
| JP | 63-70326 | 3/1988 |
| JP | 2011-215961 | 10/2011 |
| KR | 10-1158650 | 6/2012 |
| KR | 10-2013-0029606 | 3/2013 |

OTHER PUBLICATIONS

Chinese Office Action dated Sep. 26, 2016 issued in counterpart application No. 201310003892.6, 14 pages.
European Search Report dated Jul. 5, 2018 issued in counterpart application No. 18165520.0-1216, 7 pages.

* cited by examiner

SENSING APPARATUS AND METHOD
BASED ON ELECTROMAGNETIC
INDUCTION TYPE

PRIORITY

This continuation application claims priority under 35 U.S.C. § 120 to U.S. patent application Ser. No. 13/728,588, filed on Dec. 27, 2012 in the United States Patent and Trademark Office, which claims priority under 35 U.S.C. § 119(a) to a Korean Patent Application filed in the Korean Intellectual Property Office on Jan. 6, 2012, and assigned Serial No. 10-2012-0002049, the entire disclosures of which are incorporated herein by reference.

BACKGROUND OF THE INVENTION

1. Field of the Invention

The present invention relates generally to a sensing apparatus and method based on an electromagnetic induction input type, and more particularly, to a sensing apparatus and method of controlling the sensing apparatus that reduce a number of channels used.

2. Description of the Related Art

When entering a specific command into a smartphone or onto a touchscreen, a user can input the specific command or specify a particular icon by placing a part of his/her body or an Electromagnetic Induction (EI) pen on a specific position.

The contact with the part of the user's body can be implemented as a capacitive type. A touchscreen adopting the capacitive type generally includes a condenser component between transparent electrodes. When a user contacts the touchscreen with a part of his/her body, a capacity of the condenser is changed accordingly and the touch can be detected based on the change in capacity.

In this regard, the capacitive type is problematic in that an accurate input is difficult due to a relatively wide contact area that is consumed for the touchscreen contact. In contrast, an EI type requires a small area to receive an input.

For the EI type, a voltage is controlled to be applied to a loop coil arranged on a circuit board to generate an electromagnetic field for propagation to an EI pen. The EI pen may include a condenser and a loop, and may emit the propagated electromagnetic field to have a certain frequency component.

The electromagnetic field emitted by the EI pen may propagate back to the loop coil on the circuit board, thus enabling a determination of which position of the touchscreen the EI pen comes closest.

In the conventional EI type, channels for input and output signals have to be assigned for every loop coil included in the circuit board to apply an electromagnetic filed to the EI pen. Thus, if there are many loop coils on the circuit board, many channels are required and thus, the number of operations required to process signals from the channels may be increased. At the same time, high-performance processors may be required to process the increased number of operations, placing a huge burden on firmware.

SUMMARY OF THE INVENTION

The present invention has been made to address at least the above problems and/or disadvantages and to provide at least the advantages described below. Accordingly, an aspect of the present invention provides a sensing apparatus and method of controlling the sensing apparatus that may use fewer channels and accurately determine an input position of a touch object.

In accordance with an aspect of the present invention, a sensing apparatus is provided for determining an input point of a pen. The sensing apparatus includes a sensing loop unit, including a plurality of loops, configured to output a first signal in response to a signal received from the pen, wherein each of the plurality of loops includes two sub-loops separated by a predetermined distance; an area determination loop unit including at least one loop configured to output a second signal in response to the signal received from the pen; and a controller configured to determine a plurality of candidates of the input point based on the first signal and determine the input point from the plurality of candidates of the input point based on the second signal, wherein the two sub-loops are connected to each other in series, wherein one sub-loop of the two sub-loops is disposed inside of an area in which one loop of the area determination loop unit is disposed and another sub-loop of the two sub-loops is disposed outside of the area in which the one loop is disposed, and wherein each of the plurality of loops of the sensing loop unit is configured to determine the plurality of candidates of the input point.

In accordance with another aspect of the present invention, a sensing apparatus is provided for determining an input point of a pen. The sensing apparatus includes a first sensing loop unit, comprising a plurality of loops, configured to output a first signal in response to a signal received from the pen, wherein each of the plurality of loops comprises two sub-loops separated by a predetermined distance; a second sensing loop unit arranged in an outermost part of the sensing apparatus and comprising a single loop configured to output a third signal in response to the signal received from the pen; an area determination loop unit including at least one loop configured to output a second signal in response to the signal outputted from the pen; and a controller configured to determine a plurality of candidates of the input point based on the first signal when the input point lies in the first sensing loop unit and determine the input point from the plurality of candidates of the input point based on the second signal, wherein two sub-loops are connected to each other in series, wherein one sub-loop of the two sub-loops is disposed inside of an area in which one loop of the area determination loop is disposed and another sub-loop of the two sub-loops is disposed outside of the area in which the one loop is disposed, and wherein each of the plurality of loops of the first sensing loop unit is for determining the plurality of candidates of the input point.

In accordance with another aspect of the present invention, a method is provided for controlling a sensing apparatus having a sensing loop unit that includes a plurality of loops, each of the plurality of loops having two sub-loops separated by a predetermined distance, and an area determination loop unit. The method includes receiving a first signal from at least one of the plurality of loops and a second signal from the area determination loop unit; determining a plurality of candidates of an input point based on the first signal; and determining the input point from the plurality of candidates of the input point based on the second signal.

In accordance with another aspect of the present invention, a sensing apparatus is provided for determining an input point of a pen. The sensing apparatus includes a substrate that includes first, second, third, and fourth areas; a sensing loop unit, comprising a first plurality of loops and a second plurality of loops, configured to output a first signal in response to a signal received from the pen, wherein each of the first plurality of loops has two sub-loops arranged in the first area and the third area respectively, and each of the second plurality of loops has two sub-loops arranged in the third area and the fourth area respectively; an area determination loop unit that includes a first area determination loop and a second area determination loop configured to output a second signal in response to the signal received from the pen, wherein the first area determination loop is arranged in the first area or in the first and a part of the second area and the second area determination loop is arranged in the fourth area or in a part of the third and fourth area; and a controller configured to determine a plurality of candidates of the input point based on the first signal and determines the input point from the plurality of candidates of the input point based on the second signal, wherein two sub-loops are connected to each other in series, wherein one sub-loop of the two sub-loops of each of the first plurality of loops is disposed inside of an area in which the first area determination loop is disposed and another sub-loop of the two sub-loops of each of the first plurality of loops is disposed outside of the area in which the first area determination loop is disposed, and wherein each of the first and second plurality of loops is configured to determine the plurality of candidates of the input point.

In according with another aspect of the present invention, a sensing apparatus is provided for determining an input point of a pen. The sensing apparatus includes a sensing loop unit, including a plurality of loops, configured to output a first signal in response to a signal received from the pen, wherein each of the plurality of loops includes a plurality of sub-loops separated by a predetermined distance; a plurality of area determination loops configured to output a second signal in response to the signal received from the pen; and a controller configured to determine the input point based on the first signal and the second signal, wherein the plurality of sub-loops are connected to each other in series, wherein one sub-loop of the plurality of sub-loops is disposed inside of an area in which one loop of the plurality of area determination loops is disposed and another sub-loop of the plurality of sub-loops is disposed outside of the area in which the one loop is disposed, and wherein each of the plurality of loops of the sensing loop unit is configured to determine the plurality of candidates of the input point.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF EMBODIMENTS OF THE PRESENT INVENTION

Figure 1:
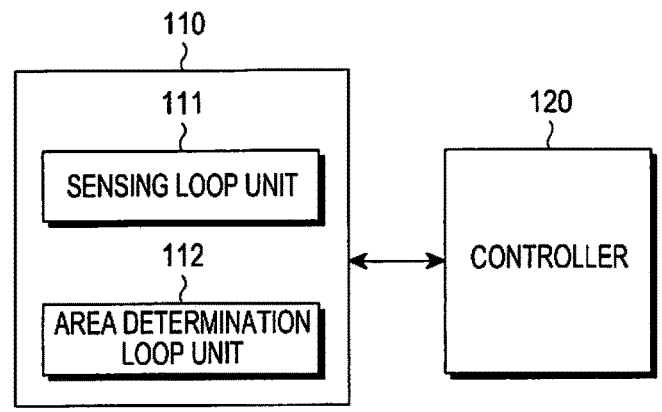
FIG. 1 is a block diagram illustrating a sensing apparatus, according to an embodiment of the present invention.

Embodiments of the present invention are described in detail with reference to the accompanying drawings. The same or similar components may be designated by the same or similar reference numerals although they are illustrated in different drawings. Detailed descriptions of constructions or processes know in the art may be omitted to avoid obscuring the subject matter of the present invention.

FIG. 1 is a block diagram illustrating a sensing apparatus, according to an embodiment of the present invention. As shown in FIG. 1, the sensing apparatus includes a loop unit 110 and a controller 120. The loop unit 110 includes a sensing loop unit 111 and an area determination loop unit 112.

The sensing loop unit 111 may include at least one loop. The loop may have two sub-loops separated by a predetermined distance. The two sub-loops may be connected in series, and each sub-loop may have one winding or multiple windings. Each sub-loop may have a predetermined area and preferably be a rectangular shape, although embodiments of the present invention are not limited thereto.

The sensing loop unit 111 may receive a received signal inputted to the sensing apparatus from outside. The received signal may originate from a touch of an object. The touch may be a means for emitting a predetermined electromagnetic field, and may be implemented with, e.g., an EI pen, a manual EI pen, etc. The EI pen that exists around the sensing loop unit 111 may receive the electromagnetic field induced from the sensing loop unit 111, and then emit the electromagnetic field back. The EI pen is just an example, and the object may be embodied as any means for receiving the electromagnetic field and then emitting it back. The sensing loop unit 111 may not only detect the received signal but may also output a predetermined transmission signal. The transmission signal may be inputted to the EI pen and then may be outputted from it.

Loops included in the sensing loop unit 111 may detect changes in electromagnetic fields. The controller 120 may determine candidates of an input point of the touch based on magnitudes of a largest sensing signal detected from a largest signal loop that detects the largest sensing signal and sensing signals detected from loops adjacent to the largest signal loop. The 'candidates of an input point' are termed because loops of the sensing loop unit 111 each have two sub-loops, and thus, the input point of the touch object is assumed to be somewhere near the two sub-loops.

The controller 120 may determine the input point of the touch from among the candidates of the input point. Specifically, the controller 120 may determine the input point of the touch from among the candidates of the input point based on an input signal from the area determination loop unit 112. Determination of the input point of the touch based on the input signal from the area determination loop unit 112 is described in greater detail below. The controller 120 may be implemented with microprocessors, Integrated Circuits (ICs), or micro-computers, but is not limited thereto, and may be embodied as any means able to perform predetermined operations.

As described above, the sensing apparatus of embodiments of the present invention may determine the candidates of the input point of the touch based on the input signal from the sensing loop unit 111. The sensing apparatus may also determine the input point of the touch based on the input signal from the area determination loop unit 112. Each loop of the sensing loop unit 111 may have two sub-loops connected in series, and thus, the number of channels is reduced in half when compared with conventional technology.

Figure 2A:
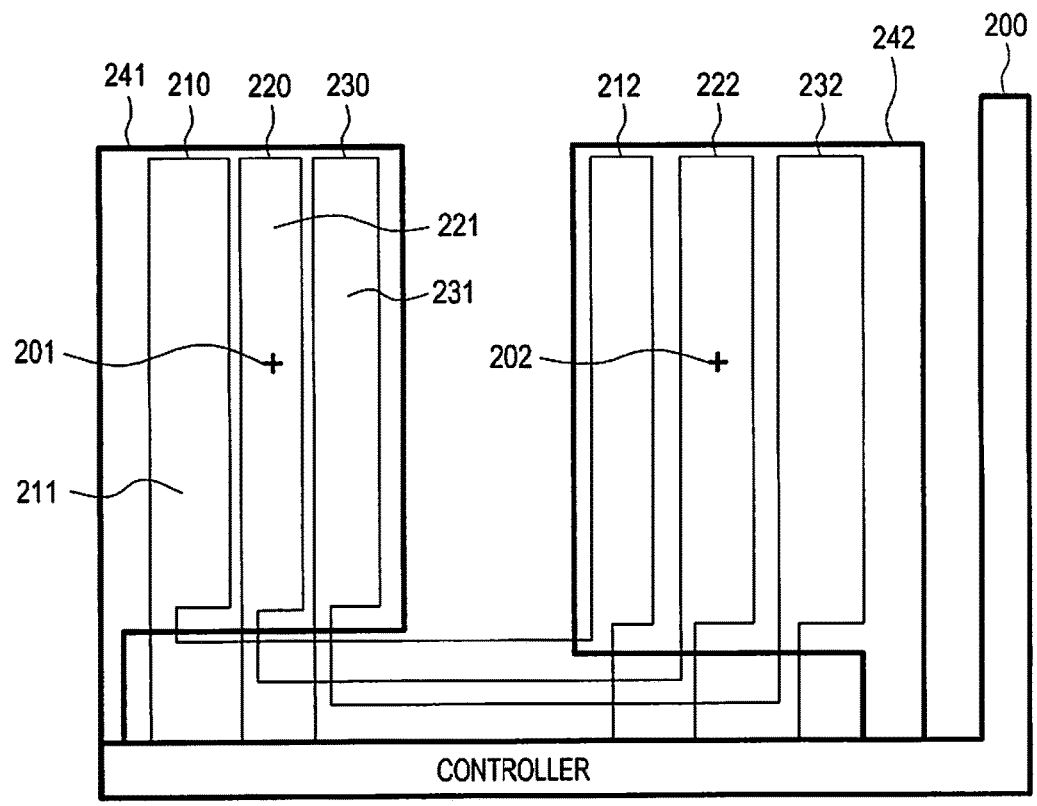
FIG. 2A is a diagram illustrating the sensing apparatus, according to an embodiment of the present invention.

FIG. 2A is a diagram illustrating the sensing apparatus, according to an embodiment of the present invention.

As shown in FIG. 2A, the sensing apparatus includes a controller 200, a first loop 210, a second loop 220, a third loop 230, a first area determination loop 241, and a second area determination loop 242. For ease in description, FIG. 2A illustrates an implementation enabling a determination of the input point of the touch in the x-direction.

The first loop 210 includes a first sub-loop 211 and a second sub-loop 212. An end of the first sub-loop 211 is connected to the controller 200, and the other end of the first sub-loop 211 is connected to an end of the second sub-loop 212. The other end of the second sub-loop 212 is connected to the controller 200. A switch may be connected between one end of the first sub-loop 211 and the controller 200, the switch being ON for a period of scanning each channel and being OFF for a non-scanning period. Accordingly, the first sub-loop 211 and the second sub-loop 212 may be connected in series.

An end of a first sub-loop 221 of the second loop 220 is connected to the controller 200, and the other end of the first sub-loop 221 is connected to an end of a second sub-loop 222 of the second loop 220. An end of a first sub-loop 231 of the third loop 230 is connected to the controller 200, and the other end of the first sub-loop 231 is connected to an end of a second sub-loop 232 of the third loop 230.

The controller 200 may determine candidates 201 and 202 of an input point based on input signals from the first, second, and third loops 210, 220, and 230. Specifically, the controller 200 may compare the input signals from the first, second, and third loops 210, 220, and 230, and determine the candidates 201 and 202 of the input point based on the largest input signal and input signals from nearby loops. As described above, each loop 210, 220, or 230 includes two sub-loops, and thus, candidates of the input point may be determined to have two.

The controller 200 may determine the input point from among the candidates of the input point based on the input signals from the area determination loop units 241 and 242. In the embodiment of the present invention illustrated in FIG. 2A, the first area determination loop 241 is a loop arranged in an area where the first sub-loop 211 of the first loop 210, the first sub-loop 221 of the second loop 220, and the first sub-loop 231 of the third loop 230 are arranged. The second area determination loop 242 is a loop arranged in an area where the second sub-loop 212 of the first loop 210, the second sub-loop 222 of the second loop 220, and the second sub-loop 232 of the third loop 230 are arranged. The first and second area determination loops 241 and 242 are each connected to the controller 200. A switch may also be connected between the first or second area determination loops 241 or 242 and the controller 200, the switch being ON during a scanning period of the area determination loops 241 or 242, and being OFF during a non-scanning period.

The controller 200 may determine the candidates of the input point to be two points 201 and 202, as described above. The controller 200 may determine the input point based on input signals from the first and second area determination loops 241 and 242. For example, if the magnitude of the input signal from the first area determination loop 241 is larger than that of the input signal from the second area determination loop 242, the controller 200 may determine the candidate 201 on the left as the input point. In another example, if the magnitude of the input signal from the second area determination loop 242 is larger than that of the input signal from the first area determination loop 241, the controller 200 may determine the candidate 202 on the right as the input point.

As described above, the controller 200 determines candidates of the input point based on signals from the loops each having two sub-loops. In the foregoing procedure, since each loop includes two sub-loops connected in series, required channels may be reduced in half. However, a loop arranged in an outermost part of the sensing loop unit 111 may include a single loop instead of two sub-loops. The method of determining the input point from candidates of the input point may have an effect of reducing an amount of operations by adopting the simple mechanism that compares magnitudes of input signals from the area determination loops.

Figure 2B:
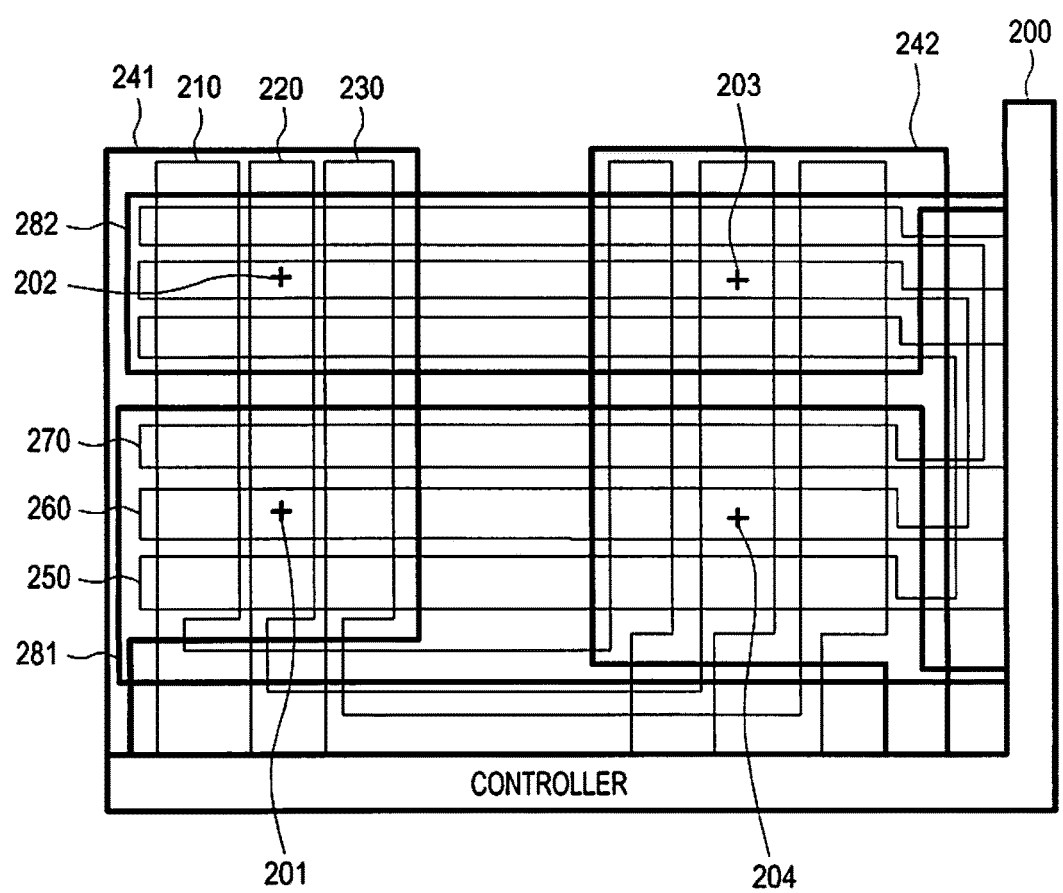
FIG. 2B is a diagram illustrating the sensing apparatus, according to another embodiment of the present invention.

FIG. 2B is a diagram illustrating the sensing apparatus, according to another embodiment of the present invention. The sensing apparatus of FIG. 2B determines input points in an x-direction and a y-direction, as opposed to the sensing apparatus of FIG. 2A.

The sensing apparatus of FIG. 2B includes the controller 200, the first loop 210, the second loop 220, the third loop 230, the first area determination loop 241, and the second area determination loop 242, as well as a forth loop 250, a fifth loop 260, a sixth loop 270, a third area determination loop 281, and a fourth area determination loop 282. The first, second, and third loops 210, 220, and 230, and the first and second area determination loops 241 and 242 are used to determine the input point of the touch in the x-direction. The fourth, fifth, and sixth loops 250, 260, and 270, and the third and fourth area determination loops 281 and 282 are used to determine the input point of the touch in the y-direction.

In the embodiment of the preset invention illustrated in FIG. 2A, the first area determination loop 241 is arranged in an area where the first sub-loop of the first loop 210, the first sub-loop of the second loop 220, and the first sub-loop of the third loop 230 are arranged. The second area determination loop 242 is arranged in an area where the second sub-loop of the first loop 210, the second sub-loop of the second loop 220, and the second sub-loop of the third loop 230 are arranged. The first and second area determination loops 241 and 242 are each connected to the controller 200.

The third area determination loop 281 is arranged in an area where the first sub-loop of the fourth loop 250, the first sub-loop of the fifth loop 260, and the first sub-loop of the sixth loop 270 are arranged. The fourth area determination loop 282 is arranged in an area where the second sub-loop of the fourth loop 250, the second sub-loop of the fifth loop 260, and the second sub-loop of the sixth loop 270 are arranged. The third and fourth area determination loops 281 and 282 are each connected to the controller 200.

The controller 200 may determine candidates of the input point in the x-direction based on input signals from the first to third loops 210 to 230, and may determine candidates of the input point in the y-direction based on input signals from the fourth to sixth loops 250 to 270. The controller 200 may determine four candidates 201, 202, 203 and 204 of the input point by combining the candidates of the input point.

The controller 200 may determine the input point in the x-direction based on input signals from the first and second area determination loops 241 and 242. For example, if the magnitude of the input signal from the first area determination loop 241 is larger than that of the input signal from the second area determination loop 242, the controller 200 may determine the candidate 201 or 202 on the left as the input point. In another example, if the magnitude of the input signal from the second area determination loop 242 is larger than that of the input signal from the first area determination loop 241, the controller 200 may determine the candidate 203 or 204 on the right as the input point.

The controller 200 may determine the input point in the y-direction based on input signals from the third and fourth area determination loops 281 and 282. For example, if the magnitude of the input signal from the third area determination loop 281 is larger than that of the input signal from the fourth area determination loop 282, the controller 200 may determine the candidate 201 or 204 in the downside as the input point. In another example, if the magnitude of the input signal from the fourth area determination loop 282 is larger than that of the input signal from the third area determination loop 281, the controller 200 may determine the candidate 202 or 203 in the upside as the input point.

The controller 200 may determine the input point based on magnitudes of input signals from the first to fourth area determination loops 241, 242, 281 and 282. For example, if the magnitude of the input signal from the first area determination loop 241 is larger than that of the input signal from the second area determination loop 242, and the magnitude of the input signal from the third area determination loop 281 is larger than that of the input signal from the fourth area determination loop 282, the candidate 201 of the input point on the lower left is determined to be the input point.

Figure 2C:
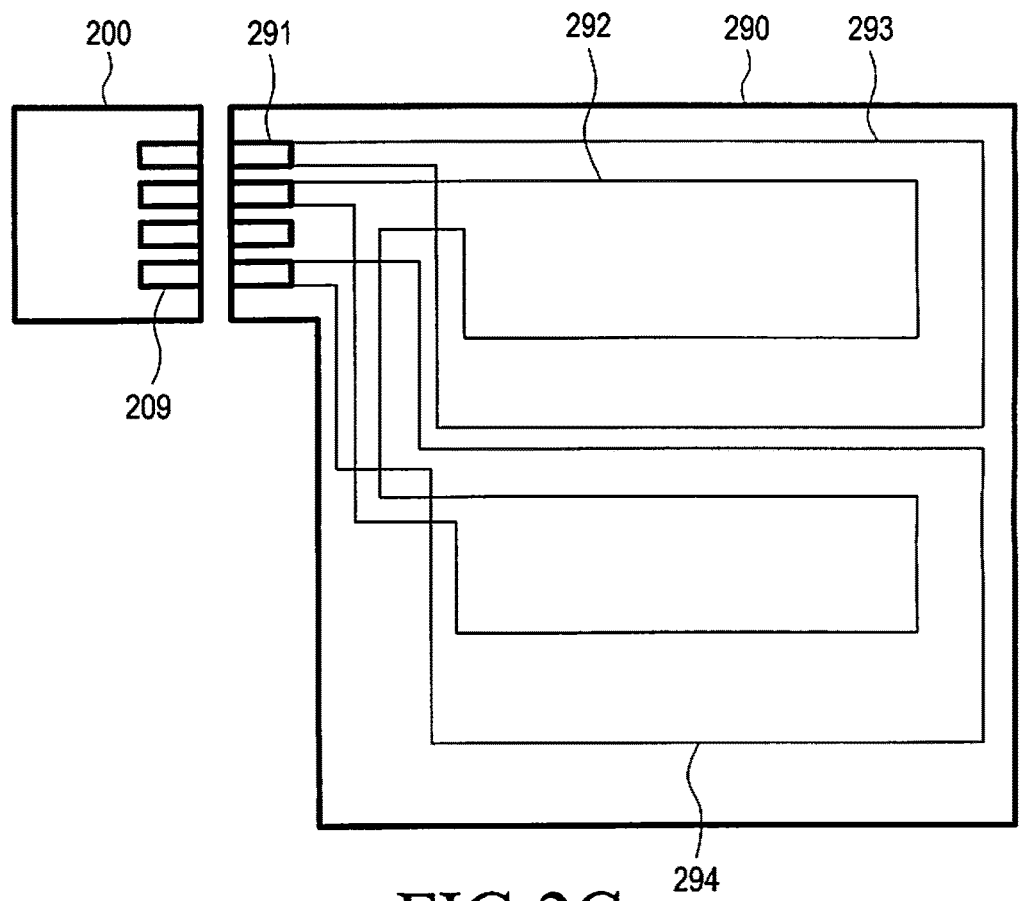
FIG. 2C is a diagram illustrating an implementation of the sensing apparatus, according to an embodiment of the present invention.

FIG. 2C is a diagram illustrating an implementation of the sensing apparatus, according to an embodiment of the present invention.

As shown in FIG. 2C, the controller 200 is implemented with ICs arranged on a printed circuit board. However, the controller 200 of FIG. 2C is just exemplary, and may be included in, e.g., a controller chip of a cell phone that has the electromagnetic sensing apparatus, or the Central Processing Unit (CPU) on the printed circuit board. The controller 200 includes a connector unit 209. The connector unit 209 may include a signal transmitting means for inputting/outputting input/output signals on a plurality of channels. The connector unit 209 may be implemented in, e.g., a gold finger form, but embodiments of the present invention are not limited thereto. The number of gold fingers shown in FIG. 2C is also exemplary.

Meanwhile, a loop unit 290 includes a sensing loop unit 292 and area determination loop units 293 and 294. Each of the sensing loop unit 292 and the area determination loop unit 293 and 294 are connected to an independent channel, i.e., an independent connector 291.

Figure 3:
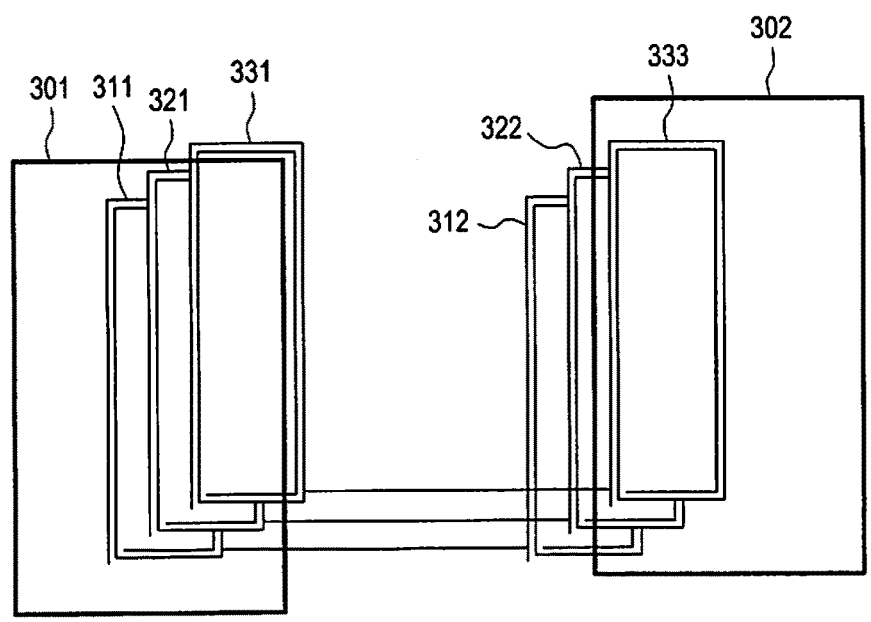
FIG. 3 is a diagram illustrating a loop arrangement of the sensing apparatus, according to an embodiment of the present invention.

FIG. 3 is a diagram illustrating a loop arrangement of the sensing apparatus, according to an embodiment of the present invention.

The sensing apparatus of FIG. 3 includes a first loop having a first sub-loop 311 and a second sub-loop 312, a second loop having a first sub-loop 321 and a second sub-loop 322, and a third loop having a first sub-loop 331 and a second sub-loop 332. Each sub-loop of each of the first to third loops may have multiple windings. Furthermore, the sensing apparatus includes first and second area determination loops 301 and 302.

When each sub-loop has multiple windings, a current induced against the same electromagnetic flux may be larger than in a case each sub-loop has a single winding. Thus, the larger magnitude of the input signal leads to more accurate control of signals and facilitates a more accurate determination of the input point. In addition, if the sub-loops emit electromagnetic fields, low power operations may be achieved.

The sensing apparatus of FIG. 3, as opposed to that of FIG. 2A, is implemented such that the area determination loops 301 and 302 do include all of the loops. As shown in FIG. 3, the first area determination loop 301 includes first sub-loops 311 and 321, and only a part of the first sub-loop 331 of the third loop.

The sensing apparatus may determine candidates of an input point based on magnitudes of input signals from loops, and may determine the input point based on magnitudes of input signals from the area determination loops 301 and 302. As such, even when the area determination loop does not include all of the sub-loops, the input point may be determined, and thus, a more flexible loop arrangement is possible.

Figure 4A:
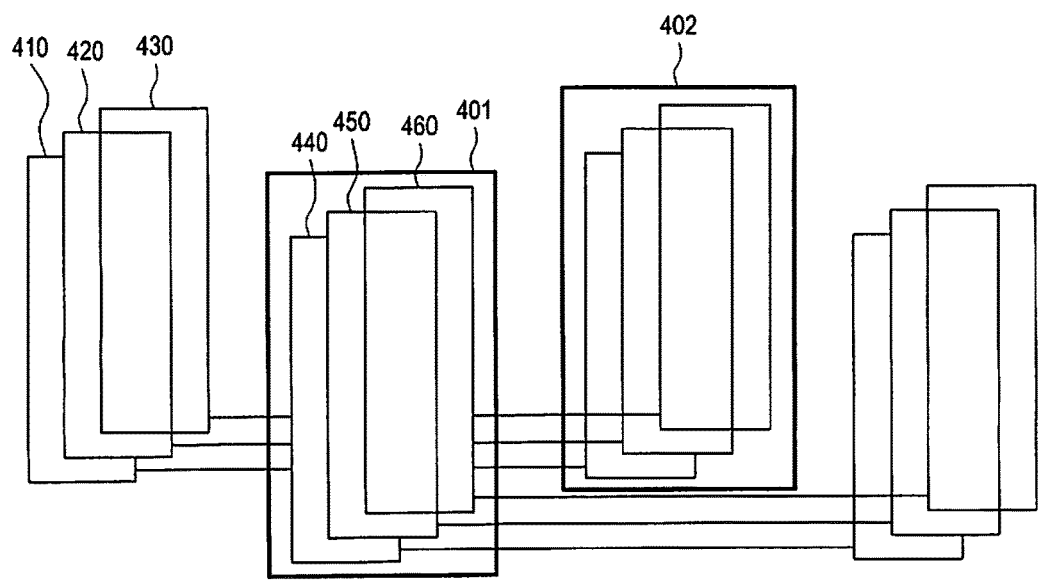
FIGS. 4A and 4B are diagrams illustrating the loop arrangement of the sensing apparatus, according to another embodiment of the present invention.

FIG. 4A is a diagram illustrating the loop arrangement of the sensing apparatus, according to another embodiment of the present invention.

In FIG. 4A, the sensing apparatus includes a first loop 410, a second loop 420, a third loop 430, a fourth loop 440, a fifth loop 450, a sixth loop 460, a first area determination loop 401, and a second area determination loop 402. The area determination loops of FIG. 4A may not includes all of the first sub-loops, as opposed to the sensing apparatus of FIG. 2A. As shown in FIG. 4A, the first area determination loop 401 only includes first sub loops of the fourth through sixth loops 440, 450, and 460. The second area determination loop 402 only includes second sub loops of the first through third loops 410, 420, and 430.

Figure 4B:
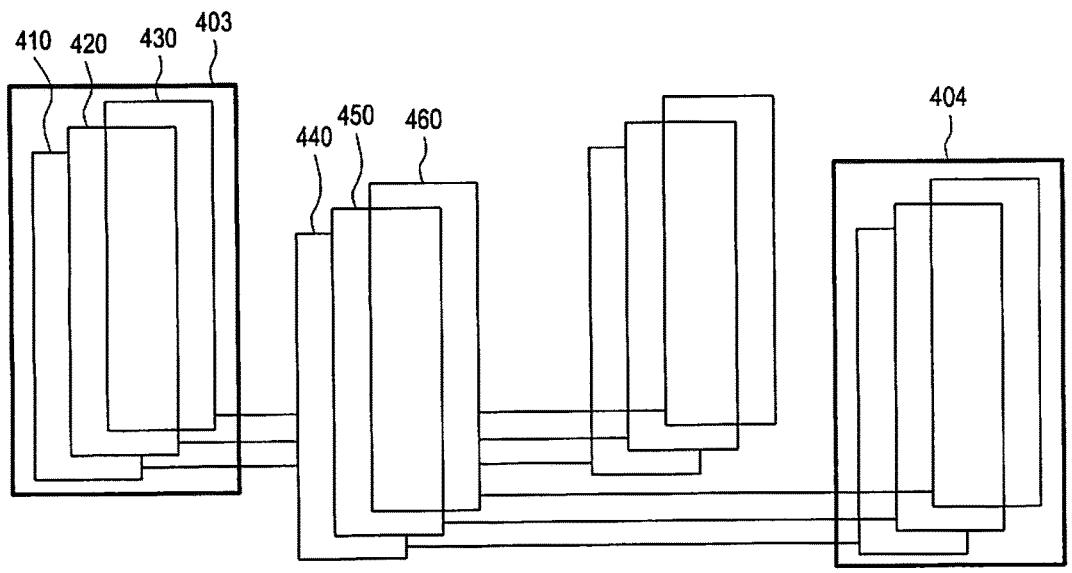

FIG. 4B is a diagram illustrating the loop arrangement of the sensing apparatus, according to another embodiment of the present invention.

In FIG. 4B, the sensing apparatus includes the first loop 410, the second loop 420, the third loop 430, the fourth loop 440, the fifth loop 450, the sixth loop 460, a first area determination loop 403, and a second area determination loop 404. The sensing apparatus of FIG. 4B is arranged, as opposed to the sensing apparatus of FIG. 4A, so that the first and second area determination loops 403 and 404 include sub-loops on the left of the first, second, and third loops 410, 420, and 430 and sub-loops on the right of the fourth, fifth, and sixth loops 440, 450, and 460, respectively. Specifically, it is assumed that an area in which sub-loops on the left of the first, second, and third loops 410, 420, and 430 is referred to as a first area, an area in which sub-loops on the left of the fourth, fifth, and sixth loop 440, 450, and 460 is referred to as a second area, an area in which sub-loops on the right of the first, second, and third loops 410, 420, and 430 is referred to as a third area, and an area in which sub-loops on the right of the fourth, fifth, and sixth loop 440, 450, and 460 is referred to as a fourth area. The first area determination loop 403 is arranged in the first area. Alternatively, the first area determination loop 403 may be arranged in parts of the first and second areas. This is because respective sub-loops of the first and second loops may be superimposed. The second area determination loop 404 may be arranged in the fourth area. Alternatively, the first area determination loop 404 may be arranged in parts of the third and fourth areas. This is because respective sub-loops of the third and fourth loops may be superimposed.

Thus, even when the area determination loop does not include all of the sub-loops, the input point may be determined, and thus, a more flexible loop arrangement is possible.

Figure 5:
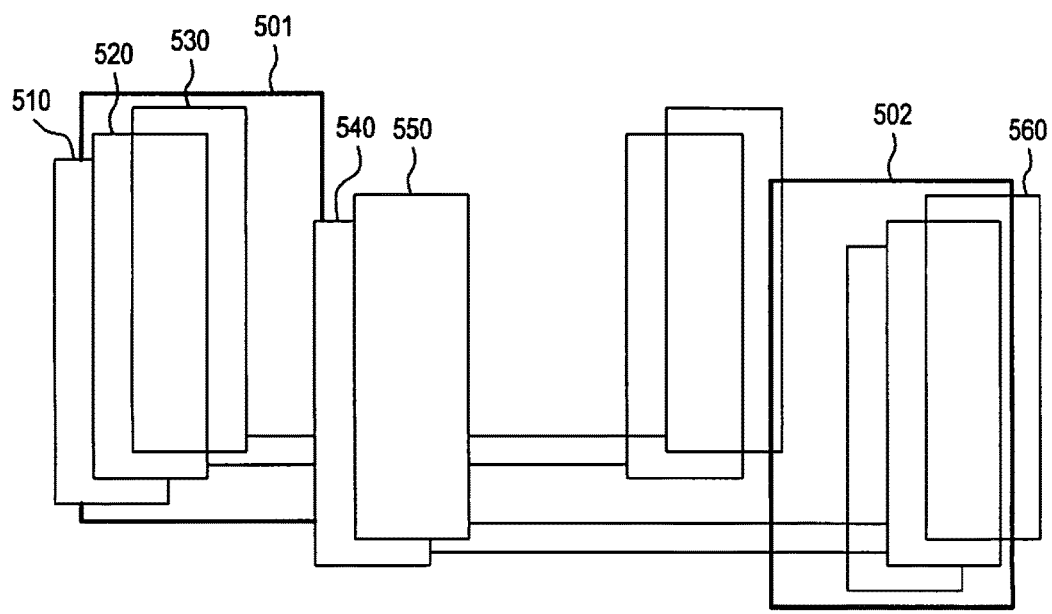
FIG. 5 is a diagram illustrating the loop arrangement of the sensing apparatus, according to another embodiment of the present invention.

FIG. 5 is a diagram illustrating a loop arrangement of the sensing apparatus, according to an embodiment of the present invention. The sensing apparatus of FIG. 5, as opposed to the sensing apparatus of FIG. 3, includes loops 510 and 560 that do not include two sub-loops. As shown in FIG. 5, some loops 520 to 550 each include two sub-loops separated by a predetermined distance, but the outermost loops 510 and 560 are each implemented in a single loop form. Thus, if it is determined that the input point is around the loops 520 to 550 that include the sub-loops, the sensing apparatus determines the input point according to the foregoing procedure in connection with FIG. 2A. If it is determined that the input point is around the loops 510 and 560 that each include a single loop, the sensing apparatus may determine the input point based on strengths of input signals from the single loops and nearby loops.

Figure 6:
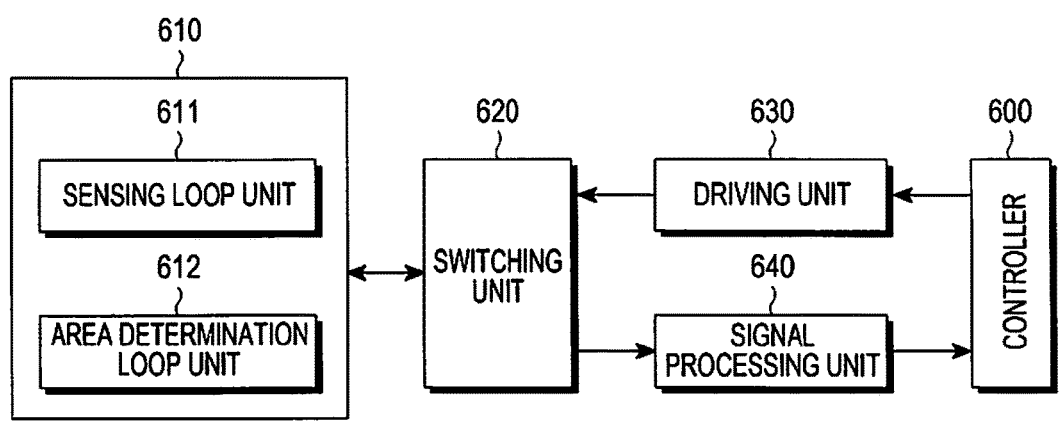
FIG. 6 is a block diagram illustrating the sensing apparatus, according to another embodiment of the present invention.

FIG. 6 is a block diagram illustrating the sensing apparatus, according to another embodiment of the present invention. The sensing apparatus includes a controller 600, a loop unit 610, a switching unit 620, a driving unit 630, and a signal processing unit 640. The loop unit 610 includes a sensing loop unit 611 and an area determination loop unit 612.

The switching unit 620 may output a current outputted from the driving unit 630 to the sensing loop unit 611 under control of the controller 600. Each loop included in the sensing loop unit 611 is controlled to be connected to the controller 600 during a scanning period, but is not connected to the controller 600 during a non-scanning period. The switching unit 620 may include a plurality of switches, each of which may be implemented with a Metal-Oxide-Semiconductor Field-Effect Transistor (MOSFET) device, a load switch, or the like. When the switch is implemented with an N-type MOSFET device, an additional bootstrapping circuit may also be included.

The driving unit 630 may generate a current and output the current to the switching unit 620. It will be obvious to one of ordinary skill in the art that the driving unit 630 may be embodied as any means for storing a certain power to generate a current at a predetermined magnitude.

The signal processor 640 may process and output an input signal from the loop unit 610 into a form to be processed by the controller 600. The signal processor 640 may include a filtering means, an amplifying means, an analog to digital converting means, etc.

Figure 7:
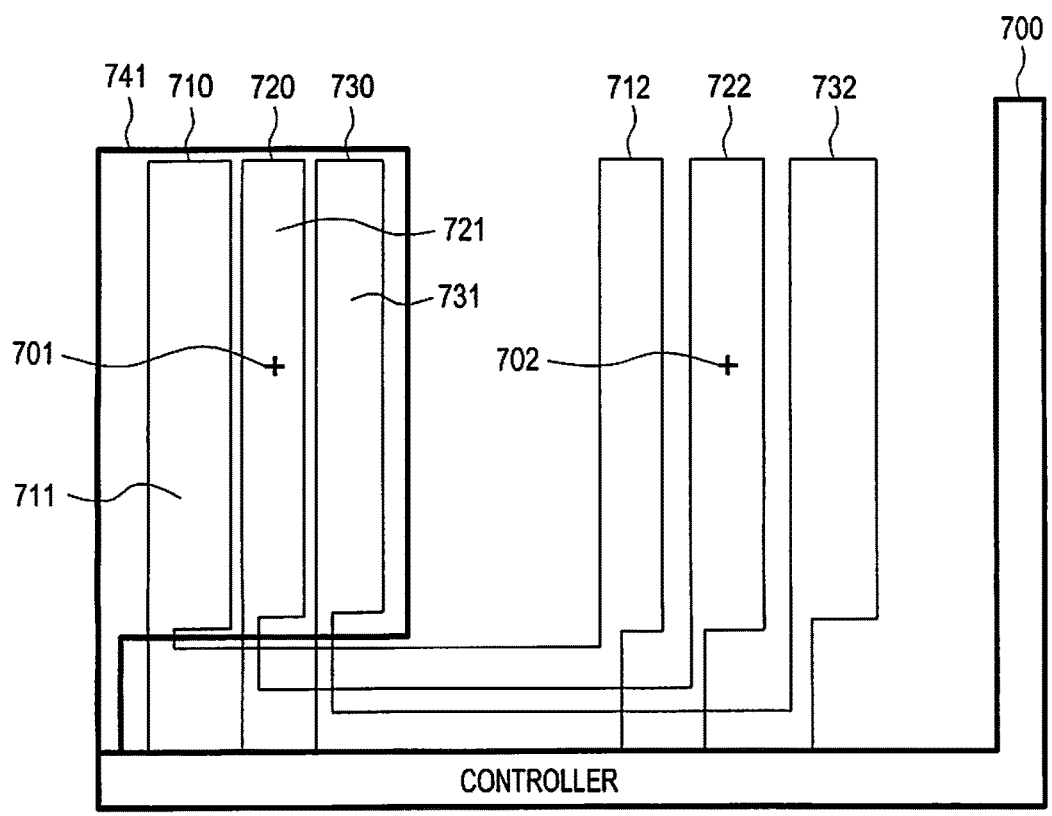
FIG. 7 is a diagram illustrating the sensing apparatus, according to another embodiment of the present invention.

FIG. 7 is a diagram illustrating the sensing apparatus, according to another embodiment of the present invention.

As shown in FIG. 7, the sensing apparatus includes a controller 700, a first loop 710, a second loop 720, a third loop 730, and an area determination loop 741. As opposed to the sensing apparatus of FIG. 2A, the sensing apparatus of FIG. 7 does not include a second area determination unit.

The controller 700 may determine candidates 701 and 702 of an input point based on input signals from first, second, and third loops 710, 720, and 730. Since each loop 710, 720, or 730 includes two sub-loops, the candidates of the input point may be determined to have two.

The controller 700 may determine the input point from among the candidates of the input point based on the input signal from the area determination loop unit 741. In the embodiment of FIG. 7, the area determination loop 741 may be a loop including an area where a first sub-loop 711 of the first loop 710, a first sub-loop 721 of the second loop 720, and a first sub-loop 731 of the third loop 730 are arranged.

The controller 700 may determine the candidates of the input point to be two points 701 and 702, as described above. The controller 700 may determine the input point based on the input signal from the area determination loop unit 741. For example, if the magnitude of the input signal from the first area determination loop 741 is larger than a predetermined value, the controller 700 may determine the candidate 701 on the left as the input point. Also, for example, if the magnitude of the input signal from the first area determination loop 741 is less than the predetermined value, the controller 700 may determine the candidate 702 on the right as the input point.

Figure 8:
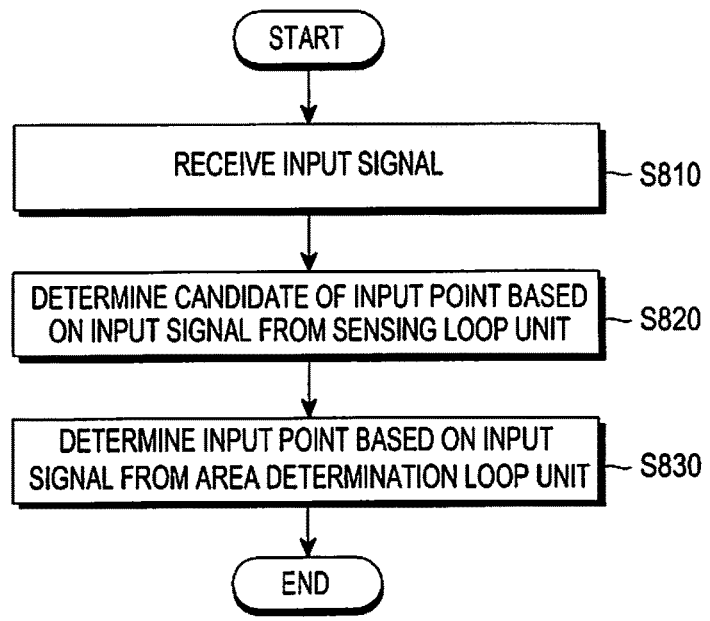
FIG. 8 is a flowchart illustrating a method of controlling the sensing apparatus, according to an embodiment of the present invention.

FIG. 8 is a flowchart illustrating a method of controlling the sensing apparatus, according to an embodiment of the present invention.

The sensing apparatus may include the sensing loop unit that includes at least one loop each having two sub-loops separated by a predetermined distance and the area determination loop unit for determining one of the two sub-loops of each of the plurality of loops that corresponds to the input point.

The sensing apparatus receives input signals from the sensing loop unit and the area determination loop unit, in step S810. The sensing apparatus determines candidates of the input point based on the input signal from the sensing loop unit, in step S820. The sensing apparatus determines the input point from among the candidates of the input point based on the input signal from the area determination loop unit, in step S830.

According to embodiments of the present invention, a sensing apparatus and method of controlling the sending apparatus that may use fewer channels and accurately determine an input position of a touch object are provided. Specifically, the sensing apparatus of embodiments of the present invention may be implemented to have approximately half the number of channels when compared with a conventional sensing apparatus. In addition, a time required for an entire scanning may be decreased. A burden on firmware may also be substantially alleviated.

In addition, the number of switches to be connected to a sensing loop is also reduced, which is followed by a reduction in the number of pins of driving chip sets and connectors. Thus, the mounting area may be reduced. Furthermore, a required driving current is decreased because of an increase of the number of windings of each loop, and a low-cost switch may be used because the switch's load is reduced.

While the invention has been shown and described with reference to certain embodiments thereof, it will be understood by those skilled in the art that various changes in form and detail may be made therein without departing from the spirit and scope of the invention as defined by the appended claims but the equivalents.

What is claimed is:

1. A sensing apparatus for determining an input point of a pen, the sensing apparatus comprising:
    a sensing loop unit, including a plurality of loops, configured to output a first signal in response to a signal received from the pen, wherein each of the plurality of loops includes two sub-loops separated by a predetermined distance;

an area determination loop unit including at least one loop configured to output a second signal in response to the signal received from the pen; and a controller configured to determine a plurality of candidates of the input point based on the first signal and determine the input point from the plurality of candidates of the input point based on the second signal, wherein the two sub-loops are connected to each other in series, wherein one sub-loop of the two sub-loops is disposed inside of an area in which one loop of the area determination loop unit is disposed and another sub-loop of the two sub-loops is disposed outside of the area in which the one loop is disposed, and wherein each of the plurality of loops of the sensing loop unit is configured to determine the plurality of candidates of the input point.

2. The sensing apparatus of claim 1, wherein the area determination loop unit comprises:

a first area determination sub-loop arranged in a part of a first area that includes a first sub-loop of the two sub-loops; and a second area determination sub-loop arranged in a part of a second area that includes a second sub-loop of the two sub-loops.

3. The sensing apparatus of claim 2, wherein the controller is further configured to compare a magnitude of the second signal from the first area determination sub-loop with a magnitude of the second signal from the second area determination sub-loop, and determine the input point based on the comparison result.

4. The sensing apparatus of claim 3, wherein the controller is further configured to determine one of two sub-loops of one of the plurality of loops which corresponds to an area determination sub-loop outputting the second signal having a greater magnitude than the input point.

5. The sensing apparatus of claim 1, further comprising a driving unit configured to provide the sensing loop unit with a current to induce an electromagnetic field; and a switching unit configured to connect each of the plurality of loops of the sensing loop unit to the controller during a scanning period of each of the plurality of loops.

6. The sensing apparatus of claim 1, wherein the two sub-loops of each of the plurality of loops have multiple windings, respectively.

7. The sensing apparatus of claim 1, wherein the area determination loop unit comprises an area determination loop arranged in one of a first area that includes a first sub-loop of the two sub-loops of each of the plurality of loops of the sensing loop unit and a second area that includes a second sub-loop of the two sub-loops of each of the plurality of loops of the sensing loop unit.

8. The sensing apparatus of claim 7, wherein the controller is further configured to determine one of two sub-loops of one of the plurality of loops of the sensing loop unit based on the second signal from the area determination loop.

9. The sensing apparatus of claim 8, wherein the controller is further configured to determine one of two sub-loops of one of the plurality of loops of the sensing loop unit which corresponds to the area determination loop as the input point, when a magnitude of the second signal from the area determination loop is greater than or equal to a predetermined magnitude.

10. The sensing apparatus of claim 8, wherein the controller is further configured to determine one of two sub-loops of the plurality of loops of the sensing loop unit which does not correspond to the area determination loop as the input point, when a magnitude of the second signal from the area determination loop is less than a predetermined magnitude.

11. The sensing apparatus of claim 1, wherein each of the plurality of loops receives an electromagnetic field emitted from the pen disposed at the input point and outputs the first signal, and wherein the area determination loop unit is further configured to receive the signal received from the pen and outputs the second signal.

12. The sensing apparatus of claim 1, wherein the sensing loop unit comprises a first plurality of loops for determining an x-axis coordinate of the input point and a second plurality of loops for determining a y-axis coordinate of the input point, and wherein the area determination loop unit comprises:

a first area determination sub-loop arranged in a part of a first area that includes a first sub-loop of the two sub-loops of each of the first plurality of loops;

a second area determination sub-loop arranged in a part of a second area that includes a second sub-loop of the two sub-loops of each of the first plurality of loops;

a third area determination sub-loop arranged in a part of a third area that includes a first sub-loop of the two sub-loops of each of the second plurality of loops; and a fourth area determination sub-loop arranged in a part of a fourth area that includes a second sub-loop of the two sub-loops of each of the second plurality of loops.

13. The sensing apparatus of claim 12, wherein the controller is further configured to determine two candidates of the x-axis coordinate of the input point based on the first signal outputted from the first plurality of loops and two candidates of the y-axis coordinate of the input point based on the first signal outputted from the second plurality of loops, and wherein the controller is further configured to determine the x-axis coordinate between the two candidates of the x-axis coordinate by comparing second signals from the first area determination sub-loop and the second area determination sub-loop, and determine the y-axis coordinate between the two candidates of the y-axis coordinate by comparing second signals from the third area determination sub-loop the fourth area determination sub-loop.

14. The sensing apparatus of claim 1, wherein all loops included in the sensing loop unit have substantially identical shape.

15. The sensing apparatus of claim 1, wherein all loops included in the sensing loop unit have the two sub-loops.

16. A sensing apparatus for determining an input point of a pen, the sensing apparatus comprising:

a first sensing loop unit, comprising a plurality of loops, configured to output a first signal in response to a signal received from the pen, wherein each of the plurality of loops comprises two sub-loops separated by a predetermined distance;

a second sensing loop unit arranged in an outermost part of the sensing apparatus and comprising a single loop configured to output a third signal in response to the signal received from the pen;

an area determination loop unit including at least one loop configured to output a second signal in response to the signal outputted from the pen; and a controller configured to determine a plurality of candidates of the input point based on the first signal when the input point lies in the first sensing loop unit and determine the input point from the plurality of candidates of the input point based on the second signal, wherein two sub-loops are connected to each other in series, wherein one sub-loop of the two sub-loops is disposed inside of an area in which one loop of the area determination loop is disposed and another sub-loop of the two sub-loops is disposed outside of the area in which the one loop is disposed, and wherein each of the plurality of loops of the first sensing loop unit is for determining the plurality of candidates of the input point.

17. The sensing apparatus of claim 16, wherein the controller is further configured to determine the plurality of candidates of the input point based on the third signal when the input point lies in the second sensing loop unit.

18. The sensing apparatus of claim 16, wherein the first sensing loop unit comprises a first plurality of loops for determining an x-axis coordinate of the input point and a second plurality of loops for determining a y-axis coordinate of the input point, and wherein the area determination loop unit comprises:
a first area determination sub-loop arranged in a part of a first area that includes a first sub-loop of the two sub-loops of each of the first plurality of loops;
a second area determination sub-loop arranged in a part of a second area that includes a second sub-loop of the two sub-loops of each of the first plurality of loops;
a third area determination sub-loop arranged in a part of a third area that includes a first sub-loop of the two sub-loops of each of the second plurality of loops; and
a fourth area determination sub-loop arranged in a part of a fourth area that includes a second sub-loop of the two sub-loops of each of the second plurality of loops.

19. The sensing apparatus of claim 18, wherein the controller is further configured to determine two candidates of the x-axis coordinate of the input point based on the first signal outputted from the first plurality of loops and two candidates of the y-axis coordinate of the input point based on the first signal outputted from the second plurality of loops when the input point lies in the first sensing loop unit, and wherein the controller is further configured to determine the x-axis coordinate between the two candidates of the x-axis coordinate by comparing second signals from the first area determination sub-loop and the second area determination sub-loop, and determine the y-axis coordinate between the two candidates of the y-axis coordinate by comparing second signals from the third area determination sub-loop and the fourth area determination sub-loop.

20. The sensing apparatus of claim 16, wherein all loops included in the first sensing loop unit have substantially identical shape.

21. The sensing apparatus of claim 16, wherein all loops included in the first sensing loop unit have the two sub-loops.

22. A method of controlling a sensing apparatus having a sensing loop unit that includes a plurality of loops, each of the plurality of loops having two sub-loops separated by a predetermined distance, and an area determination loop unit, the method comprising the steps of:

receiving a first signal from at least one of the plurality of loops and a second signal from the area determination loop unit;

determining a plurality of candidates of an input point based on the first signal; and determining the input point from the plurality of candidates of the input point based on the second signal, wherein one sub-loop of the two sub-loops is disposed inside of an area in which one loop of the area determination loop unit is disposed and another sub-loop of the two sub-loops is disposed outside of the area in which the one loop is disposed.

23. A sensing apparatus for determining an input point of a pen, the sensing apparatus comprising:

a substrate that includes first, second, third, and fourth areas;

a sensing loop unit, comprising a first plurality of loops and a second plurality of loops, configured to output a first signal in response to a signal received from the pen, wherein each of the first plurality of loops has two sub-loops arranged in the first area and the third area respectively, and each of the second plurality of loops has two sub-loops arranged in the third area and the fourth area respectively;

an area determination loop unit that includes a first area determination loop and a second area determination loop configured to output a second signal in response to the signal received from the pen, wherein the first area determination loop is arranged in the first area or in the first and a part of the second area and the second area determination loop is arranged in the fourth area or in a part of the third and fourth area; and a controller configured to determine a plurality of candidates of the input point based on the first signal and determines the input point from the plurality of candidates of the input point based on the second signal, wherein two sub-loops are connected to each other in series, wherein one sub-loop of the two sub-loops of each of the first plurality of loops is disposed inside of an area in which the first area determination loop is disposed and another sub-loop of the two sub-loops of each of the first plurality of loops is disposed outside of the area in which the first area determination loop is disposed, and wherein each of the first and second plurality of loops is configured to determine the plurality of candidates of the input point.

24. The sensing apparatus of claim 23, wherein each of the first and second plurality of loops has multiple windings.

25. The sensing apparatus of claim 23, further comprising at least one single loop arranged in an outermost part of the sensing apparatus.

26. The sensing apparatus of claim 25, wherein the at least one single loop has multiple windings.

27. The sensing apparatus of claim 23, wherein the first plurality of loops comprises a first set of plurality of loops for determining an x-axis coordinate of the input point and a second set of plurality of loops for determining a y-axis coordinate of the input point, and the second plurality of loops comprises a third set of plurality of loops for determining the x-axis coordinate of the input point and a fourth set of plurality of loops for determining the y-axis coordinate of the input point, and wherein the area determination loop unit comprises:
a first area determination sub-loop arranged in a first part of the first area and the second area;

a second area determination sub-loop arranged in a first part of the third area and the fourth area;

a third area determination sub-loop arranged in a second part of the first area and the second area; and a fourth area determination sub-loop arranged in a second part of the third area and the fourth area.

28. The sensing apparatus of claim 27, wherein the controller is further configured to determine two candidates of the x-axis coordinate of the input point based on the first signal outputted from the first set of plurality of loops for determining the x-axis coordinate of the input point and the third set of plurality of loops for determining the x-axis coordinate of the input point and two candidates of the y-axis coordinate of the input point based on the first signal outputted from the second set of plurality of loops for determining the y-axis coordinate of the input point and the fourth set of plurality of loops for determining the y-axis coordinate of the input point, and wherein the controller is further configured to determine the x-axis coordinate between the two candidates of the x-axis coordinate by comparing second signals from the first area determination sub-loop and the second area determination sub-loop, and determine the y-axis coordinate between the two candidates of the y-axis coordinate by comparing second signals from the third area determination sub-loop the fourth area determination sub-loop.

29. The sensing apparatus of claim 23, wherein all loops included in the sensing loop unit have substantially identical shape.

30. The sensing apparatus of claim 23, wherein all loops included in the sensing loop unit have the two sub-loops.

31. A sensing apparatus for determining an input point of a pen, the sensing apparatus comprising:

a sensing loop unit, including a plurality of loops, configured to output a first signal in response to a signal received from the pen, wherein each of the plurality of loops includes a plurality of sub-loops separated by a predetermined distance;

a plurality of area determination loops configured to output a second signal in response to the signal received from the pen; and a controller configured to determine the input point based on the first signal and the second signal, wherein the plurality of sub-loops are connected to each other in series, wherein one sub-loop of the plurality of sub-loops is disposed inside of an area in which one loop of the plurality of area determination loops is disposed and another sub-loop of the plurality of sub-loops is disposed outside of the area in which the one loop is disposed, and wherein each of the plurality of loops of the sensing loop unit is configured to determine the plurality of candidates of the input point.

32. The sensing apparatus of claim 31, wherein all loops included in the sensing loop unit have substantially identical shape.

33. The sensing apparatus of claim 31, wherein all loops included in the sensing loop unit have the two sub-loops.

* * * * *